United States Patent [19]
Shur

[11] Patent Number: 5,483,544
[45] Date of Patent: Jan. 9, 1996

[54] VECTOR-SPECIFIC TESTABILITY CIRCUITRY

[75] Inventor: Robert D. Shur, Los Altos, Calif.

[73] Assignee: VLSI Technology, Inc., San Jose, Calif.

[21] Appl. No.: 652,167

[22] Filed: Feb. 5, 1991

[51] Int. Cl.⁶ .................................................. G06F 11/00
[52] U.S. Cl. ........................................................ 371/27
[58] Field of Search ............................. 371/27, 15.1, 21.1, 371/22.1, 22.3, 22.4, 22.5, 22.6, 23, 29.1

[56] References Cited

U.S. PATENT DOCUMENTS

| | | | |
|---|---|---|---|
| 4,571,724 | 2/1986 | Belmondo et al. | 371/27 |
| 4,652,814 | 3/1987 | Groves et al. | 371/27 |
| 4,749,947 | 6/1988 | Gheewala et al. | 371/22.6 |
| 5,010,552 | 4/1991 | Dias et al. | 371/27 |
| 5,027,353 | 6/1991 | Jarwala et al. | 371/27 |

Primary Examiner—Robert W. Beausoliel, Jr.
Assistant Examiner—Phung M. Chung
Attorney, Agent, or Firm—John A. Frazzini

[57] ABSTRACT

Vector-specific test circuitry is added to an existing circuit design to enable improved fault test coverage by an existing fault test. Each vector-specific test circuit is designed to produce a single output indicative of whether any faults were detected in a plurality of previously unobservable node states produced in response to an associated test vector.

14 Claims, 8 Drawing Sheets

| Address | Word |
|---|---|
| 0 | 1 0 0 0 0 0 0 0 |
| 1 | 0 1 0 0 0 0 0 0 |
| 2 | 0 0 1 0 0 0 0 0 |
| 3 | 0 0 0 1 0 0 0 0 |
| 4 | 0 0 0 0 1 0 0 0 |
| 5 | 0 0 0 0 0 1 0 0 |
| 6 | 0 0 0 0 0 0 1 0 |
| 7 | 0 0 0 0 0 0 0 1 |
| 8 | 0 0 0 0 0 0 1 0 |
| 9 | 0 0 0 0 0 1 0 0 |
| 10 | 0 0 0 0 1 0 0 0 |
| 11 | 0 0 0 1 0 0 0 0 |
| 12 | 0 0 1 0 0 0 0 0 |
| 13 | 0 1 0 0 0 0 0 0 |
| 14 | 1 0 0 0 0 0 0 0 |
| 15 | 0 1 0 0 0 0 0 0 |
| 16 | 0 0 1 0 0 0 0 0 |
| 17 | 0 0 0 1 0 0 0 0 |
| 18 | 0 0 0 0 1 0 0 0 |
| 19 | 0 0 0 0 0 1 0 0 |
| 20 | 0 0 0 0 0 0 1 0 |
| 21 | 0 0 0 0 0 0 0 1 |
| 22 | 0 0 0 0 0 0 1 0 |
| 23 | 0 0 0 0 0 1 0 0 |
| 24 | 0 0 0 0 1 0 0 0 |
| 25 | 0 0 0 1 0 0 0 0 |
| 26 | 0 0 1 0 0 0 0 0 |
| 27 | 0 1 0 0 0 0 0 0 |
| 28 | 1 0 0 0 0 0 0 0 |
| 29 | 0 1 0 0 0 0 0 0 |
| 30 | 0 0 1 0 0 0 0 0 |
| 31 | 0 0 0 1 0 0 0 0 |
| 32 | 0 0 0 0 1 0 0 0 |

**Figure 1
(Prior Art)**

| Address | Word |
|---|---|
| 0 | 0 1 1 1 1 1 1 1 |
| 1 | 1 0 1 1 1 1 1 1 |
| 2 | 1 1 0 1 1 1 1 1 |
| 3 | 1 1 1 0 1 1 1 1 |
| 4 | 1 1 1 1 0 1 1 1 |
| 5 | 1 1 1 1 1 0 1 1 |
| 6 | 1 1 1 1 1 1 0 1 |
| 7 | 1 1 1 1 1 1 1 0 |
| 8 | 1 1 1 1 1 1 0 1 |
| 9 | 1 1 1 1 1 0 1 1 |
| 10 | 1 1 1 1 0 1 1 1 |
| 11 | 1 1 1 0 1 1 1 1 |
| 12 | 1 1 0 1 1 1 1 1 |
| 13 | 1 0 1 1 1 1 1 1 |
| 14 | 0 1 1 1 1 1 1 1 |
| 15 | 1 0 1 1 1 1 1 1 |
| 16 | 1 1 0 1 1 1 1 1 |
| 17 | 1 1 1 0 1 1 1 1 |
| 18 | 1 1 1 1 0 1 1 1 |
| 19 | 1 1 1 1 1 0 1 1 |
| 20 | 1 1 1 1 1 1 0 1 |
| 21 | 1 1 1 1 1 1 1 0 |
| 22 | 1 1 1 1 1 1 0 1 |
| 23 | 1 1 1 1 1 0 1 1 |
| 24 | 1 1 1 1 0 1 1 1 |
| 25 | 1 1 1 0 1 1 1 1 |
| 26 | 1 1 0 1 1 1 1 1 |
| 27 | 1 0 1 1 1 1 1 1 |
| 28 | 0 1 1 1 1 1 1 1 |
| 29 | 1 0 1 1 1 1 1 1 |
| 30 | 1 1 0 1 1 1 1 1 |
| 31 | 1 1 1 0 1 1 1 1 |
| 32 | 1 1 1 1 0 1 1 1 |

**Figure 2
(Prior Art)**

| Address | Word | | Address | Word |
|---|---|---|---|---|
| 0 | 0 1 0 1 0 1 0 1 | | 0 | 0 0 0 0 0 0 0 0 |
| 1 | 1 0 1 0 1 0 1 0 | | 1 | 0 0 0 0 0 0 0 1 |
| 2 | 0 1 0 1 0 1 0 1 | | 2 | 0 0 0 0 0 0 1 0 |
| 3 | 1 0 1 0 1 0 1 0 | | 3 | 0 0 0 0 0 0 1 1 |
| 4 | 0 1 0 1 0 1 0 1 | | 4 | 0 0 0 0 0 1 0 0 |
| 5 | 1 0 1 0 1 0 1 0 | | 5 | 0 0 0 0 0 1 0 1 |
| 6 | 0 1 0 1 0 1 0 1 | | 6 | 0 0 0 0 0 1 1 0 |
| 7 | 1 0 1 0 1 0 1 0 | | 7 | 0 0 0 0 0 1 1 1 |
| 8 | 0 1 0 1 0 1 0 1 | | 8 | 0 0 0 0 1 0 0 0 |
| 9 | 1 0 1 0 1 0 1 0 | | 9 | 0 0 0 0 1 0 0 1 |
| 10 | 0 1 0 1 0 1 0 1 | | 10 | 0 0 0 0 1 0 1 0 |
| 11 | 1 0 1 0 1 0 1 0 | | 11 | 0 0 0 0 1 0 1 1 |
| 12 | 0 1 0 1 0 1 0 1 | | 12 | 0 0 0 0 1 1 0 0 |
| 13 | 1 0 1 0 1 0 1 0 | | 13 | 0 0 0 0 1 1 0 1 |
| 14 | 0 1 0 1 0 1 0 1 | | 14 | 0 0 0 0 1 1 1 0 |
| 15 | 1 0 1 0 1 0 1 0 | | 15 | 0 0 0 0 1 1 1 1 |
| 16 | 0 1 0 1 0 1 0 1 | | 16 | 0 0 0 1 0 0 0 0 |
| 17 | 1 0 1 0 1 0 1 0 | | 17 | 0 0 0 1 0 0 0 1 |
| 18 | 0 1 0 1 0 1 0 1 | | 18 | 0 0 0 1 0 0 1 0 |
| 19 | 1 0 1 0 1 0 1 0 | | 19 | 0 0 0 1 0 0 1 1 |
| 20 | 0 1 0 1 0 1 0 1 | | 20 | 0 0 0 1 0 1 0 0 |
| 21 | 1 0 1 0 1 0 1 0 | | 21 | 0 0 0 1 0 1 0 1 |
| 22 | 0 1 0 1 0 1 0 1 | | 22 | 0 0 0 1 0 1 1 0 |
| 23 | 1 0 1 0 1 0 1 0 | | 23 | 0 0 0 1 0 1 1 1 |
| 24 | 0 1 0 1 0 1 0 1 | | 24 | 0 0 0 1 1 0 0 0 |
| 25 | 1 0 1 0 1 0 1 0 | | 25 | 0 0 0 1 1 0 0 1 |
| 26 | 0 1 0 1 0 1 0 1 | | 26 | 0 0 0 1 1 0 1 0 |
| 27 | 1 0 1 0 1 0 1 0 | | 27 | 0 0 0 1 1 0 1 1 |
| 28 | 0 1 0 1 0 1 0 1 | | 28 | 0 0 0 1 1 1 0 0 |
| 29 | 1 0 1 0 1 0 1 0 | | 29 | 0 0 0 1 1 1 0 1 |
| 30 | 0 1 0 1 0 1 0 1 | | 30 | 0 0 0 1 1 1 1 0 |
| 31 | 1 0 1 0 1 0 1 0 | | 31 | 0 0 0 1 1 1 1 1 |
| 32 | 0 1 0 1 0 1 0 1 | | 32 | 0 0 1 0 0 0 0 0 |

|  | $V_1$ | $V_8$ | $V_9$ | $V_{12}$ | $V_{15}$ | $V_{22}$ | $V_{23}$ | $V_{30}$ | $V_{37}$ | $V_{44}$ | $V_{51}$ |
|---|---|---|---|---|---|---|---|---|---|---|---|
| $S_1=1$ | X |  |  |  | X |  | X |  |  |  |  |
| $S_3=0$ |  | X |  |  |  |  |  |  |  |  |  |
| $S_3=1$ |  |  |  | X | X |  |  |  |  |  |  |
| $S_5=0$ | X | X |  |  |  |  |  |  |  | X |  |
| $S_9=0$ |  |  |  |  |  |  |  |  |  | X |  |
| $S_9=1$ |  |  |  |  |  |  |  |  | X |  |  |
| $S_{15}=0$ |  |  |  |  |  | X |  |  | X |  | X |
| $S_{17}=0$ |  |  |  |  | X |  |  |  |  |  |  |
| $S_{27}=0$ |  |  | X |  |  |  |  |  |  |  |  |
| $S_{27}=1$ |  | X |  | X |  |  |  | X | X |  |  |
| $S_{31}=1$ |  |  |  |  |  |  |  |  |  | X |  |
| $S_{32}=0$ | X |  |  | X |  | X |  |  | X |  |  |
| $S_{32}=1$ |  | X |  |  |  |  |  |  | X | X |  |
| $S_{34}=1$ |  | X |  |  |  |  |  |  | X | X |  |
| $S_{37}=0$ | X |  |  |  |  |  |  | X |  |  |  |
| $S_{41}=0$ |  | X |  |  |  |  |  |  | X |  |  |
| $S_{49}=1$ |  |  |  | X |  |  |  |  |  |  |  |
| $S_{50}=0$ |  |  |  | X |  |  |  |  |  |  |  |
| $S_{55}=0$ |  |  |  |  |  | X |  |  | X |  |  |
| $S_{57}=0$ |  |  |  |  |  |  |  |  |  | X |  |
| $S_{62}=1$ | X |  | X |  |  |  |  | X |  |  |  |
| $S_{64}=1$ |  | X |  |  |  |  |  |  |  | X | X |
| $S_{65}=0$ |  |  | X |  |  |  |  |  | X |  |  |
| $S_{67}=0$ |  |  |  |  | X |  |  |  |  |  |  |

Figure 6A

|  | $V_1$ | $V_8$ | $V_9$ | $V_{12}$ | $V_{15}$ | $V_{22}$ | $V_{23}$ | $V_{30}$ | $V_{37}$ | $V_{44}$ | $V_{51}$ |
|---|---|---|---|---|---|---|---|---|---|---|---|
| $S_1 = 1$ | X |  |  |  | X |  | X |  |  |  |  |
| $S_3 = 0$ |  | X |  |  |  |  |  |  |  |  |  |
| $S_3 = 1$ |  |  |  | X | X |  |  |  |  |  |  |
| $S_5 = 0$ | X | X |  |  |  |  |  |  |  | X |  |
| $S_9 = 0$ |  |  |  |  |  |  |  |  |  | X |  |
| $S_9 = 1$ |  |  |  |  |  |  |  |  | X |  |  |
| $S_{15} = 0$ |  |  |  |  |  | X |  |  | X |  | X |
| $S_{17} = 0$ |  |  |  | X |  |  |  |  |  |  |  |
| $S_{27} = 0$ |  |  | X |  |  |  |  |  |  |  |  |
| $S_{27} = 1$ |  | X |  | X |  |  |  | X | X |  |  |
| $S_{31} = 1$ |  |  |  |  |  |  |  |  |  | X |  |
| $S_{32} = 0$ | X |  |  | X |  | X |  |  | X |  |  |
| $S_{32} = 1$ |  | X |  |  |  |  |  |  | X | X |  |
| $S_{34} = 1$ |  | X |  |  |  |  |  |  | X | X |  |
| $S_{37} = 0$ | X |  |  |  |  |  |  |  | X |  |  |
| $S_{41} = 0$ |  | X |  |  |  |  |  |  | X |  |  |
| $S_{49} = 1$ |  |  |  | X |  |  |  |  |  |  |  |
| $S_{50} = 0$ |  |  |  | X |  |  |  |  |  |  |  |
| $S_{55} = 0$ |  |  |  |  |  | X |  | X |  |  |  |
| $S_{57} = 0$ |  |  |  |  |  |  |  |  |  | X |  |
| $S_{62} = 1$ | X |  | X |  |  |  |  | X |  |  |  |
| $S_{64} = 1$ |  | X |  |  |  |  |  |  | X | X |  |
| $S_{65} = 0$ |  |  | X |  |  |  |  | X |  |  |  |
| $S_{67} = 0$ |  |  |  |  | X |  |  |  |  |  |  |
| $S_{70} = 0$ |  |  |  |  | X |  |  |  |  |  |  |
| $S_{70} = 1$ | X |  |  |  |  |  |  |  |  |  |  |

Figure 6B

|  | $V_1$ | $V_9$ | $V_{12}$ | $V_{15}$ | $V_{22}$ | $V_{23}$ | $V_{30}$ | $V_{37}$ | $V_{44}$ | $V_{51}$ |
|---|---|---|---|---|---|---|---|---|---|---|
| $S_1 = 1$ | X |  |  | X |  | X |  |  |  |  |
| $S_3 = 1$ |  |  | X | X |  |  |  |  |  |  |
| $S_9 = 0$ |  |  |  |  |  |  |  |  | X |  |
| $S_9 = 1$ |  |  |  |  |  |  | X |  |  |  |
| $S_{15} = 0$ |  |  |  |  | X |  |  | X |  | X |
| $S_{17} = 0$ |  |  |  | X |  |  |  |  |  |  |
| $S_{27} = 0$ |  | X |  |  |  |  |  |  |  |  |
| $S_{31} = 1$ |  |  |  |  |  |  |  |  | X |  |
| $S_{32} = 0$ | X |  | X |  | X |  |  | X |  |  |
| $S_{37} = 0$ | X |  |  |  |  |  | X |  |  |  |
| $S_{49} = 1$ |  |  | X |  |  |  |  |  |  |  |
| $S_{50} = 0$ |  |  | X |  |  |  |  |  |  |  |
| $S_{55} = 0$ |  |  |  |  | X |  | X |  |  |  |
| $S_{57} = 0$ |  |  |  |  |  |  |  |  | X |  |
| $S_{62} = 1$ | X | X |  |  |  |  | X |  |  |  |
| $S_{65} = 0$ |  | X |  |  |  |  | X |  |  |  |
| $S_{67} = 0$ |  |  |  | X |  |  |  |  |  |  |
| $S_{70} = 0$ |  |  |  | X |  |  |  |  |  |  |
| $S_{70} = 1$ | X |  |  |  |  |  |  |  |  |  |

Figure 6C

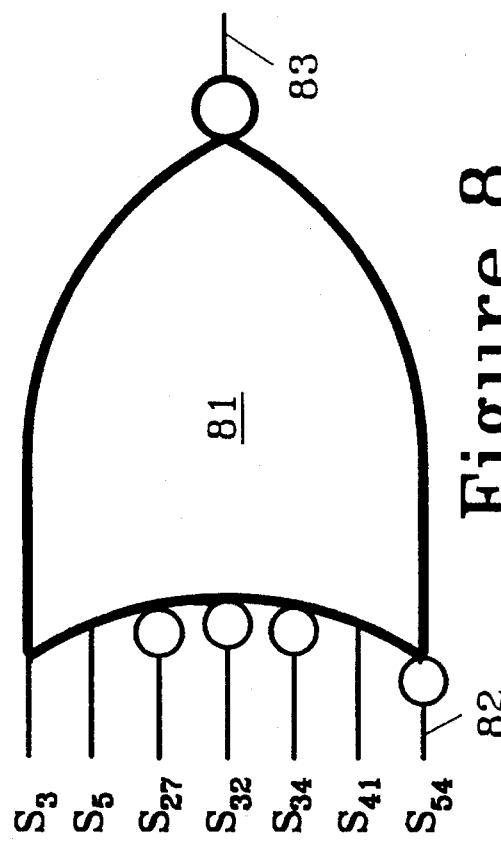
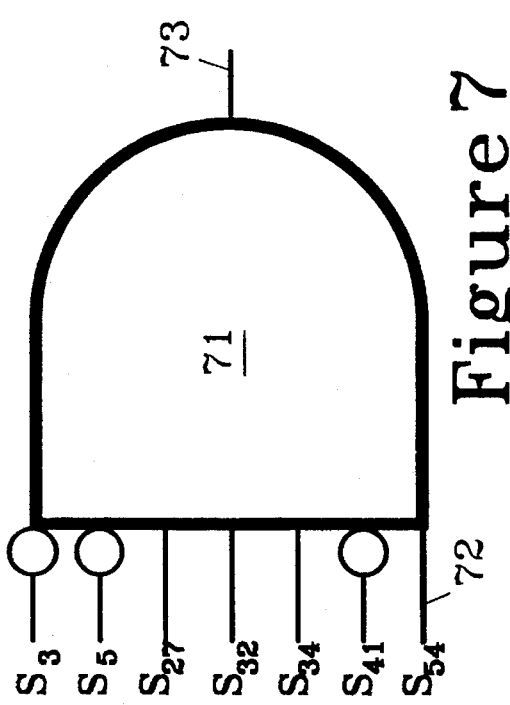
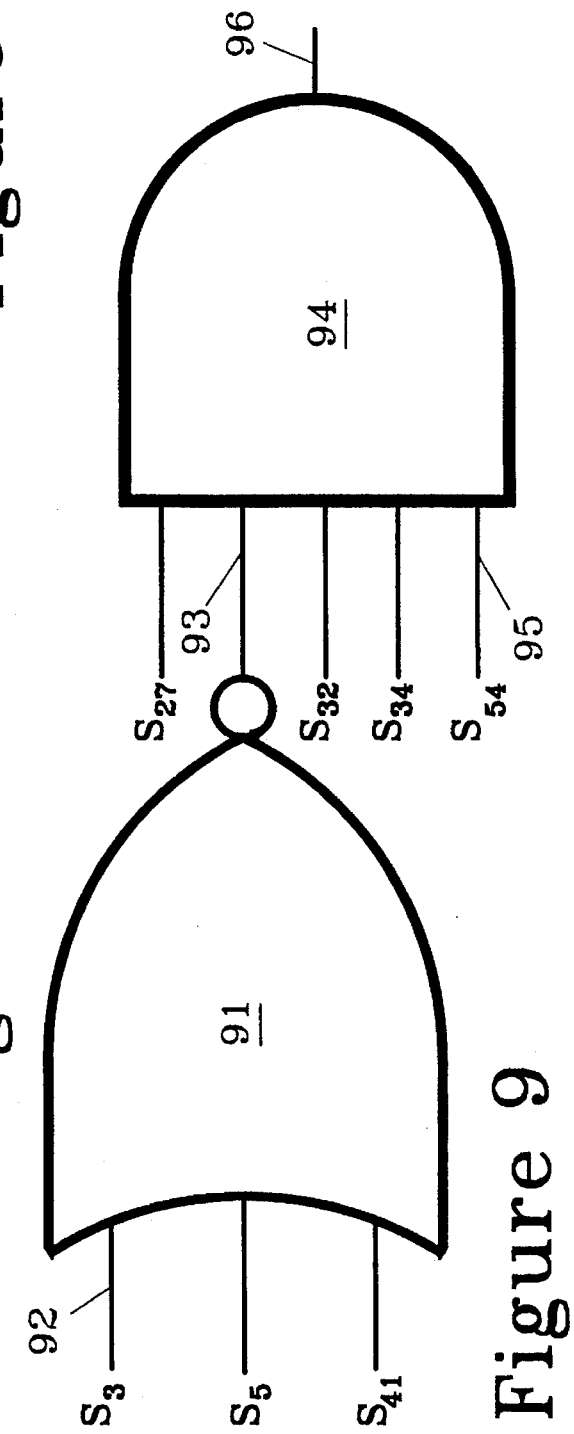
Figure 8
Figure 7
Figure 9

VECTOR-SPECIFIC TESTABILITY CIRCUITRY

BACKGROUND OF THE INVENTION

This invention relates in general to circuit testers and relates more particularly to a method of utilizing a class of vector-specific test circuits to improve fault coverage without significantly increasing Input/Output (I/O) pin count and/or I/O pin sharing.

In all integrated circuit manufacturing processes, some fraction of integrated circuits (ICs) manufactured by such processes have one or more faults. The fraction of manufactured ICs that are good is referred to as the yield of the process. Because yields can be significantly below 100%, it is important to test these ICs for faults. Preferably, chips are tested after they are each mounted into the packaging that provides protection and interfacing for connection to other chips so that faults produced by the process of packaging the chips are tested along with the faults produced by the process of manufacturing the ICs.

One class of faults that are particularly important to test are the "stuck-at faults". These faults occur because of opens and/or shorts that result in a given node being stuck at zero or stuck at one, even though, in proper operation of the IC, it should achieve each of these values under appropriate circumstances.

In general, fault testing involves two separate components: (1) controlling the voltage on various circuit nodes and (2) testing to see if the actual voltages on such nodes equal the expected values. The first of these two components is referred to as the controllability component of fault testing and the second is referred to as the observability component of fault testing. To be able to apply test signals to the IC and to observe the responses of the IC to these signals, the ICs typically contain signal inputs and outputs, referred to as test points, to enable input of test signals to the IC and output of signals from the nodes being observed.

The typical manner of testing circuits for faults is illustrated in the following examples of fault tests of random access memories (RAMs). A typical RAM test sequence consists of a first phase of writing data to the RAM and a second phase of reading this data from the RAM and comparing it with expected data. During the first phase, the fault tester produces a first sequence of addresses and, for each generated address, also produces a data word that is written to the location identified by the generated address. During the second phase, the fault tester generates the same sequence of addresses and, for each generated address, the actual data in the location identified by that address is compared with the data that is supposed to be in that location.

In one particular manner, this class of fault tests is particularly simple -namely, there is no problem in controlling or observing the state of each memory element of the RAM. The RAM can be fully tested by filling it with all possible different combinations of data and, for each combination of stored data, checking to see that each piece of stored data is correct. However, since the number of these combinations for a RAM containing N M-bit memory locations is $2^{MN}$, even at the high clock rates available today, it would take an impracticably long time to enter all of these possible combinations. Therefore, carefully chosen subsets of these possible combinations are generated (typically in accordance with some algorithm) to test for particular classes of faults. RAM test algorithms are exemplified by the walking 1's, walking 0's, checkerboard and write address algorithms illustrated in FIGS. 1-4, respectively.

Fault testing of most circuits is more difficult and inherently less complete than is possible in fault tests of RAMs because of the difficulty and/or impossibility of controlling the value of every node that should be tested and of the difficulty and/or impossibility of observing the actual value that is stored on each such node. Fault simulation tests typically provide a list of those potential faults that are tested. However, whether because of limitations on the acceptable duration of fault tests or because of the inability to control and/or observe some of the circuit nodes of interest, fault tests will in general be incomplete. The fraction of possible faults that are actually tested by a given fault test is referred to as the "fault coverage" of such test.

In the article by Lawrence W. Goldstein, et al, entitled SCOAP: *Sandia Controllability/Observability Analysis Program*, a program is discussed that analyzes the controllability/observability problem of various circuits. Circuits are divided into two classes of circuits: combinational circuits in which the binary value of every node is uniquely determined at any given time by the data applied at that time on the input lines; and sequential (i.e., state-dependent) circuits that each includes memory elements (e.g., flipflops) so that, at any given time, the binary value of at least some of the circuit nodes depends not only on the input data at that time, but also on at least some previously applied input data and on the initial state of this circuit. Sequential circuits are particularly difficult to test because of the state-dependent nature of its response to test input. Fault tests for sequential circuits will therefore generally exhibit a lower fault coverage than will combinational circuits having a comparable number of components.

The article by Thomas W. Williams, et al entitled *Design for Testability-A Survey*, IEEE Transactions On Computers, vol. C-31, No. 1, January 1982, discusses a fault test technique, referred to as the Level-Sensitive Scan Design, that addresses the difficulty of testing sequential circuits. This technique utilizes a "shift register latch" to convert a network into a purely combinational circuit.

As circuit complexity and density has increased, the difficulty of generating test patterns and simulating faults has drastically increased. The article by Williams et al presents a number of other testing techniques and approaches, some of which are applicable to many circuits and others that are limited to narrow classes of circuits. One of these techniques addresses the problem that the duration of a fault test is approximately proportional to the number of logic gates to the power 3. In accordance with this technique, jumpers and/or gates are included in a circuit board to enable components on a circuit board to be isolated (i.e., "partitioned"). This enables each of these isolated components to be separately tested, thereby greatly reducing the time required for a fault test of the entire circuit board. For example, if the board consists of M components, each containing on the order of N logic gates, then a test of the entire circuit requires a time interval approximately proportional to $(MN)^3$. In contrast to this, a test of the isolated components requires a time proportional to $M*(N^3)$ which has reduced the test time by a factor of $M^2$.

Because of the extremely large number of nodes of typical circuits manufactured today, it has gotten extremely difficult to access all of the nodes that need to be accessed either to apply test signals or that need to be observed to produce test output. It is also difficult to access all of these nodes through the limited number of test points that can be placed on a chip. As indicated in the article by Thomas W. Williams, et al, shift registers are often included in circuits to enable a string of test data to be output through a single output test point.

The problem of limited IC surface area available for input/output (I/O) test points is also addressed in U.S. Pat. No. 4,749,947 entitled *Grid-Based, "Cross-Check" Test Structure For Testing Integrated Circuits,* issued to Tuchar R. Gheewala on Jun. 7, 1988. This cross-check test structure utilizes a set of M horizontal probe lines that form a rectangular grid of intersections with a set of N vertical sense lines. This enables a rectangular array of MN test points, each located near one of these intersections, to be monitored. Only one probe line is activated at any given time. If the mth probe line is activated, then the test points adjacent to the mth row of intersections of the grid are each output to an associated one of the vertical sense lines. In other embodiments, the total number of input and output points required for fault testing can be reduced to 6 by use of various devices such as shift registers.

SUMMARY OF THE INVENTION

During testing by any given fault test, there are generally a plurality of nodes on which either the zero or the one state was produced at least once during this fault test, but this state was not observable. In accordance with the illustrated preferred embodiment, vector-specific test circuits are utilized to improve fault coverage without significantly increasing Input/Output (I/O) pin count and/or I/O pin sharing. Each of these vector-specific circuits has a plurality of inputs, each of which is connected to a node on which, at some time during the fault test, an unobservable state was produced.

In accordance with this testing method, each node is assigned a unique identifier (e.g., a unique number, letter, or x-y coordinate within the chip). Each of these nodes can be in one of two binary electrical states: the zero state or the one state. If the ith node is in the zero state, this will be referred to herein as the "node state" $S_i=0$ and if it is in the binary one state this will be referred to herein as the node state $S_i=1$.

During testing, a set of signal inputs, referred to herein as input test points $T_1, \ldots, T_M$ of the circuit, are utilized to apply test signals to this circuit. At any given time, the set of values of these M test signals is referred to herein as a "test vector". The jth of these test vectors is indicated herein as $V_j$. Thus, if the binary value of the kth input test point is represented as $T_j^k$, then the jth test vector can be represented as $V_j=(T_j^1, T_j^2, \ldots, T_j^M)$.

For sequential circuits, there are some fault tests that are state-dependent-that is, it is not only necessary to observe a certain node state, it is important to observe that node state at the time of application of a particular one of the test vectors. For state-independent fault tests, such as stuck-at fault tests, the observed node states can be observed at any time during the test. These latter types of state-independent fault tests are easier to implement.

During any particular fault test there may be some node states that are never expected to occur during this fault test even though such node state can occur during normal device operation. For example, during this particular test, there may be a node m that is expected to be in the node state $S_m=1$ at all times during the fault test. That the state $S_m=0$ is not produced at any time during this fault test is an issue of controllability. This issue is not addressed herein. What is addressed herein is the issue: for all node states that are produced by any given fault test, are any of these actually generated node states unobservable. If there are, then the circuit design is modified to include one or more vector-specific test circuits that make some of these previously unobservable node states observable.

To determine the number of such vector-specific circuits that are to be added to a given circuit and to determine the structure of these vector-specific circuits, a table is made that correlates all presently unobservable node states of the existing circuit with those test vectors that produce these unobservable node states. A decision is then made as to which of these unobservable node states are to be observed. Some of the node states selected to be made observable can be included because it is particularly important to observe that node state. However, in most cases, the set of node states that are selected to be made observable is determined by a desire to have some minimum level of fault coverage.

Because the number of input/output (I/O) test points on the IC will usually need to be increased to provide access to these vector-specific test circuits and because it is important to keep the number of additional I/O pins low, it is advantageous to achieve the desired level of fault coverage by adding only the minimal number of vector-specific circuits needed to achieve the desired fault coverage. If each of these vector-specific test circuits is to be coupled to an associated additional I/O test point, then the space available for such additional I/O test points can be the limiting device parameter that limits the number of vector-specific test circuits that can be added to the IC.

The number of vector-specific test circuits needed to achieve the desired level of fault coverage can be substantially minimized by the following procedure. First, those test vectors on this list are identified that produce the maximal number of unobservable node states. One of these vectors is selected and the list is modified to remove all references to those node states produced in response to this first selected test vector. On this modified list, those test vectors that produce the maximal number of unobservable node states are identified. One of these vectors is selected and the list is again modified in this manner. This procedure is repeated until the set of unobservable node states produced by this set of selected vectors exceeds the number of unobservable states that are to be made observable.

For each of these vectors, a vector-specific test circuit is added to the IC design to make these node states observable. These vector-specific circuits can have the form of a multiple input AND gate in which some of the inputs can be inverting inputs. The outputs of these AND gates are coupled to circuit output test points so that it can be determined whether these nodes all have their expected values. In other embodiments, data compression circuitry, such as shift registers, can be coupled to one or more of the inputs and/or outputs of these vector-specific test circuits to reduce the number of additional I/O test points required to access these vector-specific test circuits. These vector-specific test circuits can also have the form of other functional equivalents of such AND gate.

This class of vector-specific test circuits is particularly attractive because only a single output need be observed to check whether all of the node states made observable by this circuit indeed occur at the time of application of the associated test vector. Therefore, these circuits substantially reduce the number of I/O test points that need to be added to the circuit to be able to observe these newly observable node states. Because of the limited area of the chip, if each output of a vector-specific test circuit is to be separately observable, then the maximum number of I/O test points that can be fitted on the chip will determine the maximum number of vector-specific test circuits that can be added to the IC. However, several techniques are available to collect data from a multiplicity of such vector-specific circuits and output such data from the IC over a single I/O test point. For example, each output of a vector-specific circuit can be input to an associated bit of a shift register and then this data can be read by shifting it though a single output of the shift register.

DESCRIPTION OF THE FIGURES

FIG. 1 illustrates a walking 1's pattern in memory,

FIG. 2 illustrates a walking 0's pattern in memory,

FIG. 3 illustrates a checkerboard pattern in memory.

FIG. 4 illustrates a write-address pattern in memory,

FIGS. 6A–6C illustrate a method of identifying a succession of test vectors that cooperatively enable a selected number of additional previously unobservable node states to be observed by a substantially minimal number of vector-specific test circuits.

FIG. 7 illustrates a particular vector-specific test circuit that tests a set of n previously unobservable node states during one test cycle.

FIGS. 8 and 9 illustrate alternate embodiments of the vector-specific test circuit of FIG. 7.

DESCRIPTION OF THE PREFERRED EMBODIMENT

For any given circuit under test and for any given fault test used to test this circuit, the degree of fault coverage is increased to a selected level of fault coverage by the method illustrated in FIG. 5 and FIGS. 6A–6D. Typically, because of the inability to produce every node state that should be tested, in a typical fault test, there is inherently less than full fault coverage. This is a problem of controllability that is not addressed by the present invention. Likewise, in a typical fault test, it is possible to observe only a portion of all of the node states that are actually produced by the fault test. This is a problem of observability that is addressed by the present invention.

In accordance with the present invention, at least some of the unobservable node states that are actually produced are made observable by including in the circuit under test vector-specific circuits that enable testing of some of these node states. A systematic method of selecting these vector-specific circuits is presented and specific examples of these vector-specific circuits are illustrated.

Figure 5:
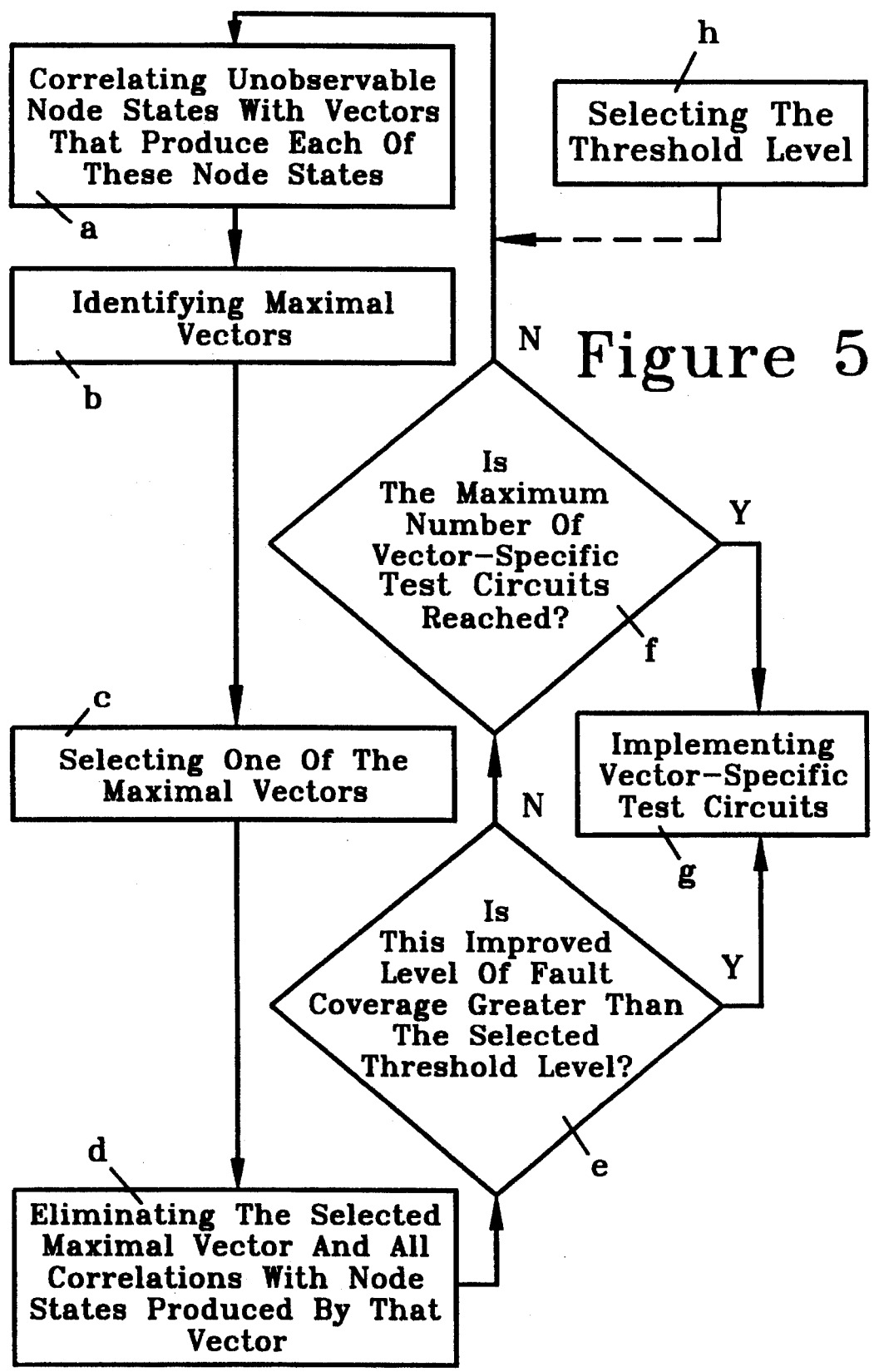
FIG. 5 is a flow diagram of the method of FIGS. 6A–6C.

In accordance with the method of selecting these vector-specific circuits, each unobservable node state s; that is produced by the given fault test is correlated with all test vectors v; that generate that node state (step a in FIG. 5). This correlation can take the form of a table (such as that illustrated in FIG. 6A) that correlates all presently unobservable node states with all vectors that produce any of these node states. In FIG. 6A, the unobservable node states s; that are actually generated by the fault test are listed along the vertical axis of this table and the complete set of test vectors v; that each generate at least one of the unobservable node states is listed along the horizontal axis of this table. The correlation between each of these node states and a test vector that generates that node state is indicated by the presence of an x at the intersection of the row representing that node state and the column representing that vector.

Those vectors are identified (step b in FIG. 5) that produce the greatest number of presently unobservable node states. Such vectors are referred to herein as "maximal vectors". In FIG. 6B, the three maximal vectors are $V_8$, $V_{37}$ and $V_{44}$, each producing seven unobservable node states.

One of these maximal vectors is selected for use with an associated vector-specific test circuit to test for all of these previously unobservable node states (step c in FIG. 5). In this particular case, the maximal vector $V_8$ is selected, simply because it is the first listed of these vectors. As will be discussed below, other choices may actually turn out to be preferable. However, each of these choices will result in a selection of vectors and associated node states generated by these selected vectors which result in substantially minimizing the number of vector-specific circuits required to achieve a given choice of fault coverage. It should be noted that the threshold level of fault coverage is inherently limited by the inability to produce all of the node states that should be observed (i.e., the controllability issue) so that this determines the upper limit of fault coverage that can be achieved by the method and associated vector-specific circuitry presented herein.

This table is now modified to eliminate this vector and all of the node states that are now testable by the associated vector-specific test circuit when this vector is applied. That is, every row corresponding to one of these newly observable node states is eliminated from this table and the column corresponding to this vector is eliminated from this table (step d in FIG. 5). The elements that are to be deleted from this table are underlined in FIG. 6B. The table resulting from the deletion of these elements is illustrated in FIG. 6C.

A threshold level of fault coverage is selected (step h) at some time during the above-indicated steps. Typically, this level is selected before step a, but since this determination is not needed before this point in the design procedure, this decision can be put off to this point in the procedure. The dashed line connecting element h to elements a–g signifies that his is the preferred point of the connection from step a into the remainder of the flow diagram, but that step a could be connected to any other node of this flow diagram.

The level of fault coverage is now calculated for the modified circuit that includes the vector-specific test circuit that implements testing of the node states produced by vector $V_8$ and is compared with the threshold level (step e). If this level has not been reached, then steps a–e are repeated. If this level has been reached, then the vector-specific test circuit associated with each of these selected vectors are designed and incorporated into the circuit (step g). It is convenient to delay design and implementation of these vector-specific test circuits until all of the associated vectors have been selected, but each such circuit can alternatively be designed or designed and implemented at each pass around the loop a–f in FIG. 5.

In an alternate embodiment of this method, after step e, a step f is executed in which the number of vector-specific test circuits required to this point in the analysis is compared with some maximal number of such circuits that will be implemented. For example, because of surface area limitation for I/O test points for the outputs of these vector-specific test circuits, there may be some maximal number of circuits that either can be, or will be allowed to be, implemented.

Another alternate embodiment of this method can implement a more reasoned approach in step c to selecting which maximal vector to utilize. For example, a computer program can easily evaluate the resulting fault coverage that will result along any path of selections that result from the various possible choices available in step 2. There will be one or more of these paths that result in the threshold being achieved with the fewest number of vector-specific test circuits or that achieves the highest level of fault coverage when the maximum allowed number of vector-specific test circuits is reached.

It is also possible to implement a procedure that circumvents the structured approach of FIG. 5 and replaces steps b and c by a new step of just selecting any vector without regard to its impact on fault coverage. This method can then be implemented for all possible paths of selection to produce a more complete set of data thereby enabling a true minimization of the number of vector-specific test circuits that are required to reach a selected level of fault coverage.

In a further variant of the method of FIG. 5, the maximal vectors are defined to include, in addition to those vectors of FIG. 5, any vector that produces a node state that is in some way critical, or, at least particularly important, to device operation. Thus, step b is modified to implement this definition of maximal vector. Step c is now modified to require that the maximal vector selected in this step be one of these "critical maximal vectors" if any are still among the set of maximal vectors. Otherwise, the procedure is as discussed above in regard to FIG. 5.

The preferred embodiment of the vector-specific test circuits is illustrated in FIG. 7 for vector $V_8$. Since $V_8$ produces seven associated unobservable node states, this circuit is an AND gate 71 having seven inputs 72, each of which is coupled to an associated one of the nodes on which are produced the node states to be observed. Each node that is to be high (i.e., a "1" state) when this vector is applied by the fault test is coupled to an associated noninverting input of this AND gate. Each input to a node that is to be low (i.e., a "0" state) when this vector is applied by the fault test is coupled to an associated inverting input of this AND gate. Thus, the signal produced at an output 73 of this AND gate is high only if all of the node states observed by this AND gate are correct. Thus, this vector-specific test circuit enables all seven of these node states to be tested concurrently at the occurrence of the associated test vector and the result can be detected on a single output 73, thereby providing significant reduction in the number of output test points needed to observe these node states.

There are a number of circuits that are "functional equivalents" of the vector-specific test circuit of FIG. 7. One trivial example, is the same device modified to have an inverting output.

Another example of a functional equivalent is a NOR gate that is the Boolean logic equivalent of this AND gate. That is, according to Boolean logic:

$$A_1 \circledR A_2 \circledR (\sim A_3) \circledR A_4 = \sim[(\sim A_1) \oplus (\sim A_2) \oplus A_3 \oplus (\sim A_4)] \quad (1)$$

where ~ represents the logical NOT operation, ⓇR represents the logical AND operation and ⊕ represents the logical OR operation. In such NOR gate, each inverting input of the AND gate becomes a noninverting input of the NOR gate and each noninverting input of the AND gate becomes an inverting input of the NOR gate. This embodiment is illustrated in FIG. 8. It consists of a NOR gate 81 having three noninverting inputs 82 and four inverting inputs 82 and one inverting output 83.

Another functional equivalent of an AND gate is an AND gate in which a first subset of the inputs are applied directly to this AND gate and a second subset of the inputs are applied to an NOR gate having its output connected to a noninverting input of the AND gate. For example, FIG. 9 illustrates a functional equivalent of the vector-specific circuits of FIGS. 7 and 8. The three inverting inputs 72 of FIG. 7 become noninverting inputs 92 to a NOR gate 91 and the output 93 of this NOR gate is applied to a noninverting input of an AND gate 94. The four noninverting inputs 72 to AND gate 71 each becomes a noninverting input 95 of AND gate 94. The output signal is produced on an output 96. This embodiment has the advantage of simplicity and reduced size. Because these embodiments are all functional equivalents of an AND gate, the words "AND gate" herein will include not only a traditional AND gate, but in additional will include all functional equivalents that produce the response characteristic of an AND gate. The words "vector-specific AND gate" mean an AND gate having a noninverting input for each binary 1 node state that is to be observed at the occurrence of an associated test vector and has an inverting input for each binary 0 node state that is to be observed at the occurrence of this associated test vector. The words "vector-specific AND gate" also mean any functional equivalent of such AND gate.

Figure 10:
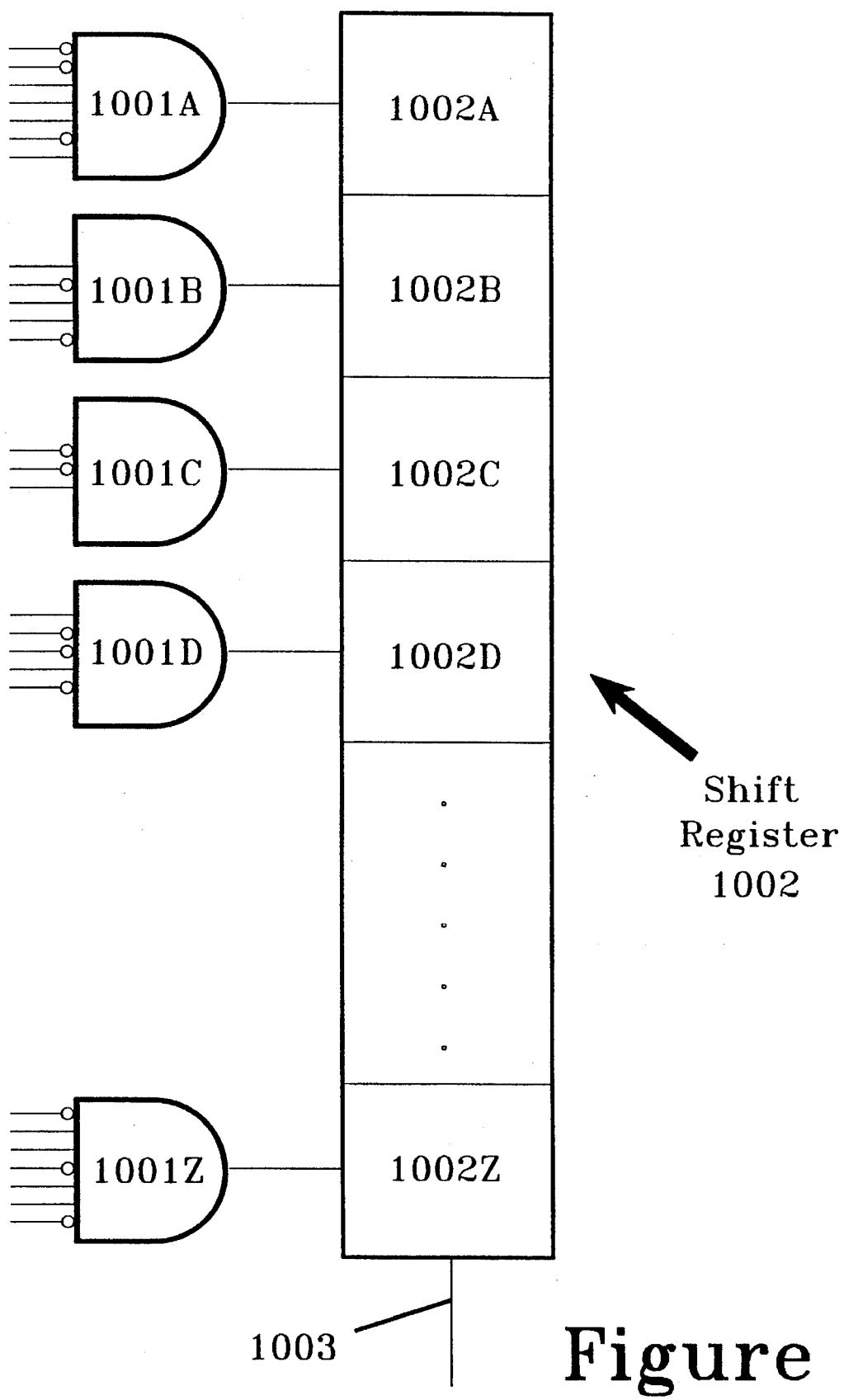
FIG. 10 illustrates an embodiment that utilizes a register that enables data from all vector-specific test circuits to be output from the IC through a single I/O test point.

As illustrated in FIG. 10, to reduce the number of output test points required to implement these vector-specific test circuits, a plurality of AND gates 1001A–1001Z each has its output connected to an input of an associated stage of a shift register 1002A–1002Z. This enables the information from all of these vector-specific test circuits to be output over only a single output line 1003.

I claim:

1. A method of improving a calculated fault coverage of an integrated circuit by a fault test, wherein said fault test applies a plurality of test vectors to said integrated circuit to produce a plurality of node states in said integrated circuit, said method comprising the steps of:

(a) for each of at least one unobservable node state of this integrated circuit, identifying at least one test vector that produces said unobservable node state;

(b,c) selecting one of these identified test vectors that produces a plurality of said unobservable node states; and (g) implementing in said integrated circuit a vector-specific test circuit that is associated with said selected test vector and that tests a plurality of the node states produced by the test vector selected in step (b,c) to see whether all of these tested node states are in a correct state when the test vector selected in step (b,c) is applied to said integrated circuit.

2. A method as in claim 1 wherein said vector-specific test circuit implemented in step (g) tests at least some of the previously unobservable node states produced by the vector chosen in step (b,c).

3. A method as in claim 1 wherein, in step (b,c), the test vector selected in step (b,c) is a maximal vector, thereby maximally improving fault coverage.

4. A method as in claim 1 wherein, in step (b,c), this vector is a maximal vector.

5. A method as in claim 6 further comprising the steps (e1) and (e2) of:

(e1) calculating a fault coverage of said integrated circuit as modified by step (g); and (e2) determining whether the fault coverage of this modified circuit exceeds a threshold level of fault coverage and, if not, then repeating steps (a)–(e2) until said threshold level of fault coverage is achieved.

6. A method as in claim 4 further comprising the steps (e1) and (e2) of:

(e1) calculating a fault coverage of said integrated circuit as modified by step (g); and (e2) determining whether the fault coverage of this modified circuit exceeds a threshold level of fault coverage and, if not, then repeating steps (a)–(e2) until a maximum number of vector-specific test circuits are implemented.

7. A method of improving a fault coverage of an integrated circuit by a fault test, wherein said fault test applies a plurality of test vectors to said integrated circuit to produce a plurality of node states in said integrated circuit, said method comprising the steps of:

(a) for each of at least one unobservable node state of this integrated circuit, identifying at least one test vector that produces said at least one unobservable node state;

(b,c) selecting one of these identified test vectors that produces a plurality of said unobservable node states; and (g) implementing in said integrated circuit a vector-specific test circuit that is associated with said selected test vector and that tests a plurality of the node states produced by the test vector selected in step (b,c) to see whether all of these tested node states are in a correct state when the test vector selected in step (b,c) is applied to said integrated circuit, wherein, in step (a), this step of correlating is performed for all of the unobservable node states of said integrated circuit.

8. A method of improving a calculated fault coverage of an integrated circuit by a fault test, wherein said fault test applies a plurality of test vectors to said integrated circuit to produce a plurality of node states in said integrated circuit, said method comprising the steps of:

(a) for each of at least one unobservable node state of this integrated circuit, identifying at least one test vector that produces at least one of said at least one unobservable node state;

(b,c) selecting one of these identified test vectors that produces a plurality of said unobservable node states; and (g) implementing in said integrated circuit a vector-specific test circuit that is associated with said selected test vector and that tests a plurality of the node states produced by the test vector selected in step (b,c) to see whether all of these tested node states are in a correct state when the test vector selected in step (b,c) is applied to said integrated circuit, wherein step (b,c) comprises the steps of:

(b) identifying all of said vectors that are maximal vectors; and (c) selecting one of these maximal vectors.

9. A method of improving a fault coverage of an integrated circuit by a fault test, wherein said fault test applies a plurality of test vectors to said integrated circuit to produce a plurality of node states in said integrated circuit, said method comprising the steps of:

(a) for each of at least one unobservable node state of this integrated circuit, identifying at least one test vector that produces said at least one unobservable node state;

(b,c) selecting one of these identified test vectors that produces a plurality of said unobservable node states;

(g) including in said integrated circuit a vector-specific test circuit having inputs connected to each node on which is to be measured a node state produced in response to said selected test vector and that, when said selected test vector is applied to the integrated circuit, said vector-specific test circuit produces an output signal that is in a first binary state only if all of the node states on nodes coupled to the inputs of this vector-specific test circuit are at expected node state values;

(d) eliminating said selected vector and all correlations involving node states that are tested by the vector-specific test circuit of step (g); and repeating steps (a) and (b,c) and executing step (g) for the vector selected in this repeat of steps (a) and (b,c).

10. An integrated circuit having an improved level of fault coverage by an associated fault test, said integrated circuit comprising:

a first circuit, having a first set of test points, that, in response to application of a first test vector applied during said fault test, produces node states on a plurality of nodes of this first circuit;

a vector-specific test circuit having a plurality of inputs, each of which is connected to an associated node of said circuit on which, upon execution of a first test vector during said fault test, a node state is produced that would be unobservable if said vector-specific test circuit were not included, said vector-specific test circuit producing a binary indication of whether said otherwise unobservable node states all assume expected node state values.

11. An integrated circuit as in claim 10 wherein said vector-specific test circuit is an AND gate having a plurality of inputs, each of which is connected to an associated node on which a node state is produced in response to said first test vector during said fault test, wherein said node state would be unobservable if this vector-specific test circuit were disconnected from said associated node, each of these AND gate inputs being a noninverting input if said otherwise unobservable node state should be high and being an inverting input if said otherwise unobservable node state should be low.

12. An integrated circuit as in claim 10 wherein said vector-specific test circuit comprises:

a NOR gate having a plurality of inputs, each of which is connected to an associated node on which a binary 0 node state should be produced in response to said first test vector during said fault test, wherein said binary 0 node state would be unobservable if this vector-specific test circuit were disconnected from said associated node; and an AND gate having a plurality of noninverting inputs, one of which is connected to an output of the NOR gate and the remainder of which are each connected to an associated node on which an otherwise unobservable binary 1 node state should be produced in response to said first test vector during said fault test, wherein said binary 0 node state would be unobservable if this vector-specific test circuit were disconnected from said associated node.

13. An integrated circuit as in claim 10 wherein said vector-specific test circuit comprises:

a register having a plurality of stages, each of which has an input;

at least one vector-specific AND gate each having a plurality of inputs connected to nodes of the first circuit and having its output connected to an input of one of the stages of the register.

14. An integrated circuit as in claim 13 wherein said register is a shift register that has an output on which each bit of data in this register can be shifted out to an output test point, whereby only a single output test point is required for output of fault test data from this register.

* * * * *